United States Patent [19]
Fujiyoshi et al.

[11] Patent Number: 5,406,087
[45] Date of Patent: Apr. 11, 1995

[54] SPECIMEN-HOLDING DEVICE FOR ELECTRON MICROSCOPE

[75] Inventors: Yoshinori Fujiyoshi, Osaka; Mikio Naruse, Tokyo, both of Japan

[73] Assignees: Protein Engineering Research Institute, Osaka; JEOL Ltd., Tokyo, both of Japan

[21] Appl. No.: 183,149

[22] Filed: Jan. 18, 1994

[30] Foreign Application Priority Data

Jan. 18, 1993 [JP] Japan .................................. 5-005828

[51] Int. Cl.6 ........................................... H01J 37/20
[52] U.S. Cl. ................................. 250/440.11; 250/311
[58] Field of Search ..................... 250/440.11, 441.11, 250/442.11, 311

[56] References Cited
U.S. PATENT DOCUMENTS 4,071,766  1/1978  Kalman et al. ....................... 250/443
5,225,683  7/1993  Suzuki et al. .................... 250/442.11

Primary Examiner—Paul M. Dzierzynski
Assistant Examiner—Kiet T. Nguyen
Attorney, Agent, or Firm—Webb Ziesenheim Bruening Logsdon Orkin & Hanson

[57] ABSTRACT

There is disclosed a simple specimen-holding device for use with an electron microscope. The device comprises a pair of films which transmit the electron beam. The films are reinforced with a network of reinforcing members and placed on a specimen stage. A specimen to be investigated is held in a thin space formed between the films, together with moisture. The fringes of the films are compressed together to hermetically isolate the space between the films from the specimen chamber of the microscope which is evacuated. The electron beam passes through the thin space sandwiched between the films. This permits the specimen to be observed in an almost unmodified state with little damage to the specimen.

5 Claims, 3 Drawing Sheets

SPECIMEN-HOLDING DEVICE FOR ELECTRON MICROSCOPE

FIELD OF THE INVENTION

The present invention relates to a specimen-holding device which is for use with an electron microscope and permits observation of chemical reactions in liquid solution including biological specimens or the like in an almost unmodified state.

BACKGROUND OF THE INVENTION

In electron microscopy, a specimen is observed while placed in a high vacuum. Therefore, if the specimen is a biological specimen, it dries. This makes it impossible to observe the specimen in the unmodified state. To cope with this situation, an atmospheric pressure specimen-holding device using an environmental cell as shown in FIG. 5 has been developed.

Referring to FIG. 5, the environmental cell, indicated by 2, is placed in a microscope column 1. A specimen 8 in an unmodified state is held in the cell 2. A moist gas is introduced into the cell 2 through an intake port 3. Also, water is admitted into the cell 2 through a water intake port 4. The cell 2 is connected with an exhaust port 5, and the inside of the cell 2 is evacuated by a vacuum pump (not shown). Magnetic pole pieces 9a and 9b of an objective lens 9 are mounted, respectively, above and below the specimen. An electron beam converged by the objective lens 9 is directed to the specimen 8 via sealing films 6 and 7. An image of the specimen is created from electrons transmitted through the specimen 8.

Although the environmental cell 2 is evacuated by the vacuum pump, the inside of the cell is kept permeated with a gaseous ambient containing moisture, because gas and water are supplied into the cell 2. Consequently, the specimen is prevented from drying. Thus, the specimen can be observed in an almost unmodified state.

In the specimen holder shown in FIG. 5, the environmental cell 2 is thick and so the electron beam collides with water molecules and other substances contained in the cell, thus producing a large amount of beam induced ions. The produced ions bombard the specimen and thus damage it. This damage to the specimen is much heavier than the damage that the specimen sustains by electron beam irradiation. Hence, the specimen cannot be observed in its intact state.

In the above-described prior art specimen holder, a system for supplying water into the cell, equipment for evacuating the cell, and a control system for controlling the water supply system and the evacuating equipment are needed. This makes the whole apparatus bulky and complex. Also, the apparatus is not satisfactorily economical to fabricate.

It is an object of the present invention to provide a specimen-holding device which is for use with an electron microscope or the like and which permits a specimen to be observed in an almost unmodified state.

It is another object of the invention to provide a specimen-holding device which is for use with an electron microscope or the like and which permits a specimen to be observed in an almost unmodified state, is relatively simple in structure and is economical to fabricate.

In the present invention, a pair of films transmitting an electron beam are reinforced with a network of reinforcing members. A specimen to be investigated is held between these films. The fringes of the films are seal by O-rings, thus hermetically isolating the space sandwiched between the films. The specimen is observed within an atmosphere where water exists. Since the specimen is merely sandwiched between the films, the atmosphere through which the electron beam passes can be made quite thin. When the beam is made to impinge on the specimen, only a small amount of ions is produced inside the atmosphere. Consequently, the damage to the specimen by ion bombardment is negligibly small.

SUMMARY OF THE INVENTION

In one embodiment of the invention, a specimen-holding device for use with an electron microscope producing an electron beam and having an evacuated specimen chamber comprises: a pair of films which transmit the electron beam and between which a specimen is placed; a hermetical sealing mechanism for hermetically sealing fringes of said films to isolate a space sandwiched between said films from said specimen chamber; and a specimen holder on which the specimen sandwiched between the films is placed.

BRIEF DESCRIPTION OF THE DRAWINGS

Other objects and features of the invention will appear in the course of the description thereof, made with reference to the drawings in which.

DETAILED DESCRIPTION OF THE INVENTION

Figure 1:
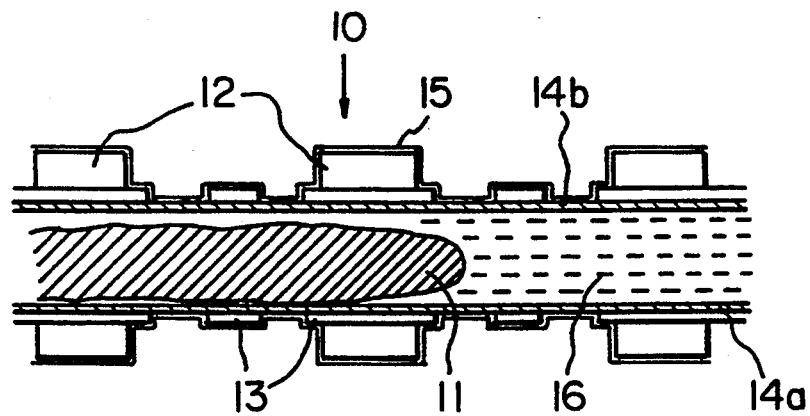
FIG. 1 is a fragmentary enlarged cross section of specimen-holding films for placing a specimen within ambient water.
Figure 2:
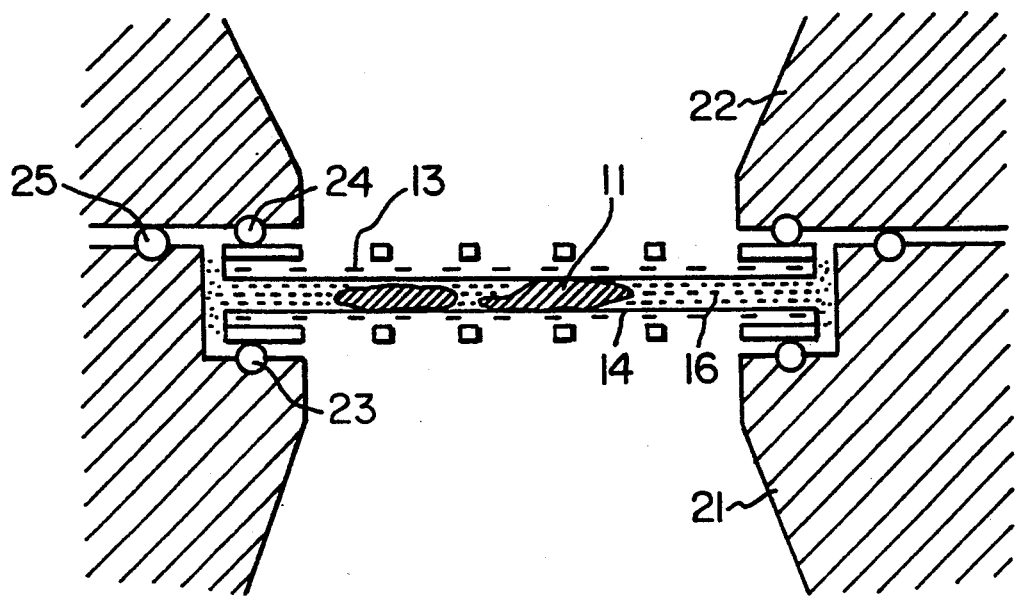
FIG. 2 is a schematic cross section showing a vacuum seal structure mounted on the fringes of the specimen-holding films shown in FIG. 1.

Referring to FIG. 1, there are shown specimen-holding films for placing a specimen immersed in water. FIG. 2 shows a vacuum seal structure mounted on the fringes of the specimen-holding films. A specimen-holding device according to the invention is completely shown in FIGS. 3(a) and 3(b). This device is for use with an electron microscope emitting an electron beam EB.

Figure 3A:
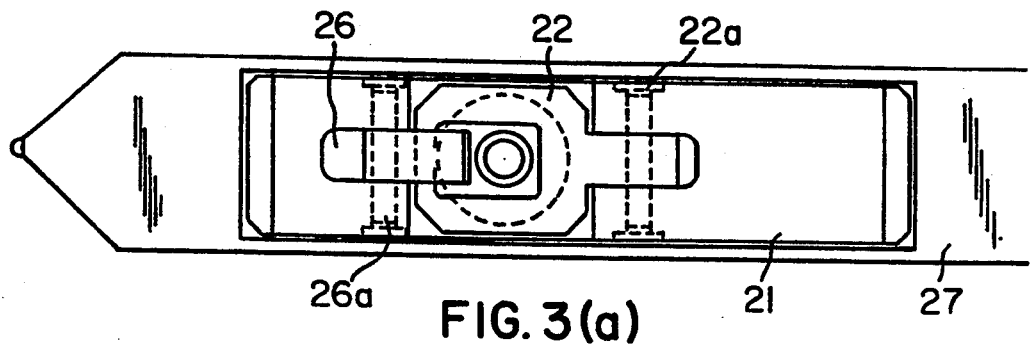
FIG. 3(a) is a plan view of a specimen-holding device according to the invention.
Figure 3B:
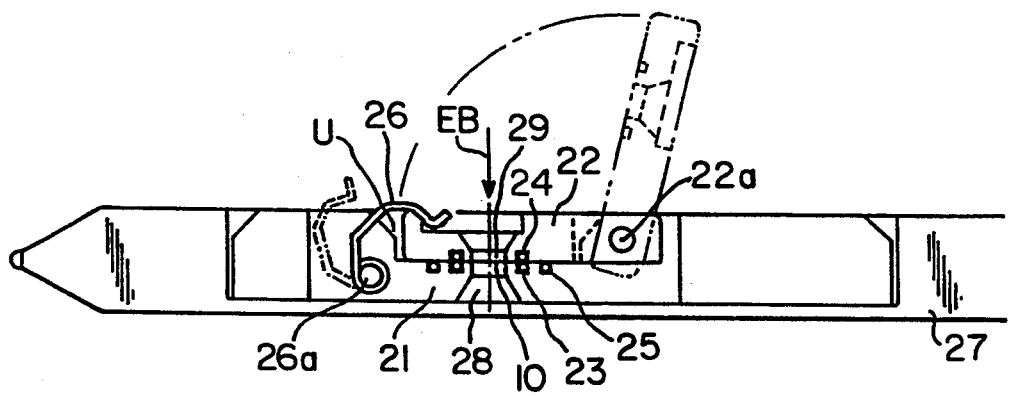
FIG. 3(b) is a side cross-sectional view of the specimen-holding device shown in FIG. 3(a)
Figure 5:
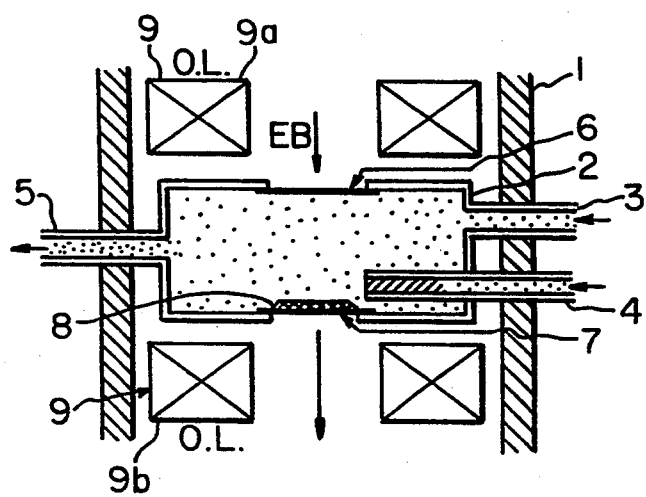
FIG. 5 is a diagram of the prior art specimen-holding device.

Referring to FIGS. 3(a) and 3(b), the specimen holder 27 is inserted from a direction perpendicular to the optical axis of the electron beam E into a position lying along the optical axis of the beam. A specimen stage 21 is mounted to the specimen holder 27 and is provided with a recessed portion U in which a specimen support 10 (described later) is placed. The specimen stage 21 is formed with a hole 28 permitting passage of the electron beam. A first O-ring 23 ms mounted to the specimen stage 21 in an annular recess around the beam passage hole 28. A second O-ring 25 is mounted to the specimen stage 21 in an annular recess outside the first O-ring 23. Furthermore, a specimen-holding plate 22 is mounted to the specimen stage 21 so as to be rotatable about a pivot (shaft) 22a. The specimen-holding plate 22 is also provided with a hole 29 permitting passage of the electron beam E. An O-ring 24 is mounted in an annular recess on the specimen-holding plate 22 in an opposed relation to the first O-ring 23. In order to press the fringe of the specimen support 10 against the specimen stage 21, a presser spring 26 is mounted to the specimen stage 21. The presser spring 26 rotates from a position indicated by the phantom line to a position indicated by the solid line about a pivot (shaft) 26a. When the presser spring is rotated into the position indicated by the solid line, the presser spring locks the specimen-holding plate 22 by its resilient force.

The specimen support 10 is described now by referring to FIG. 1. The specimen support 10 has a pair of specimen-holding films 14a, 14b and a specimen 11 sandwiched between the films. Water or air or both exist together with the specimen 11 inside the space surrounded by the specimen-holding films. The bottom specimen-holding film is described first. Metallic strips 12 have meshes of about 100 microns wide. A micro-grid 13 having meshes of several microns is stuck on the metallic strips 12. Thin films 14a and 14b of polyvinyl resin are placed on the micro-grid 13. Since the films 14a and 14b are not sufficiently electrically conductive, if the films are irradiated with the electron beam, then electric charge will be induced on the films. This charge will deflect the electron beam and disturb the final image. To prevent such electric charge, carbon is deposited as a carbon film 15 on the thin polymer films 14. The specimen 11 is placed on one of the specimen-holding films prepared in this way. The other identical film is placed on the specimen from above. Then, the specimen is pressed between the films. Where the space surrounded by the specimen-holding films is water, specimen 11 is immersed in water dropped with a syringe onto the polymer film 14a which is fixed on the micro-grid 13. Then, the other film 14b is placed on the specimen.

The specimen support 10 prepared in this way is placed on the specimen stage 21 as shown in FIG. 2. Subsequently, the specimen-holding plate 22 is rotated from the position indicated by the phantom line into the position indicated by the solid line. Also, the presser spring 26 is rotated to lock the specimen-holding plate 22 by pressing it against the specimen stage 21 with resilient force. Under this condition, as can be seen from FIG. 2, the space enclosed by the thin films 14a and 14b is closed and hermetically isolated by the O-rings 23, 24 and 25 from the specimen chamber of the microscope which is evacuated. Under this closed condition, the thin films 14a and 14b are attracted toward the evacuated specimen chamber. To prevent the films 14a and 14b from being damaged by the attraction, the aforementioned metallic strips 12 and micro-grid 13 are provided. Those metallic strips 12 which are positioned vertically symmetrically are so mounted that their meshes register with each other.

In this structure, when the electron beam EB is made to impinge on the specimen support 10, the beam EB is transmitted through the carbon film 15 and one thin film 14b and hits the specimen 11 within the ambient water. The electron beam EB transmitted through the specimen 11 is transmitted through the other thin film 14a of polyvinyl resin and directed toward the lens system. An electron optical image based on the electron beam EB transmitted through the specimen in this way is projected onto a display screen or a camera tube. As a result, the specimen can be observed in an almost unmodified state.

Figure 4A:
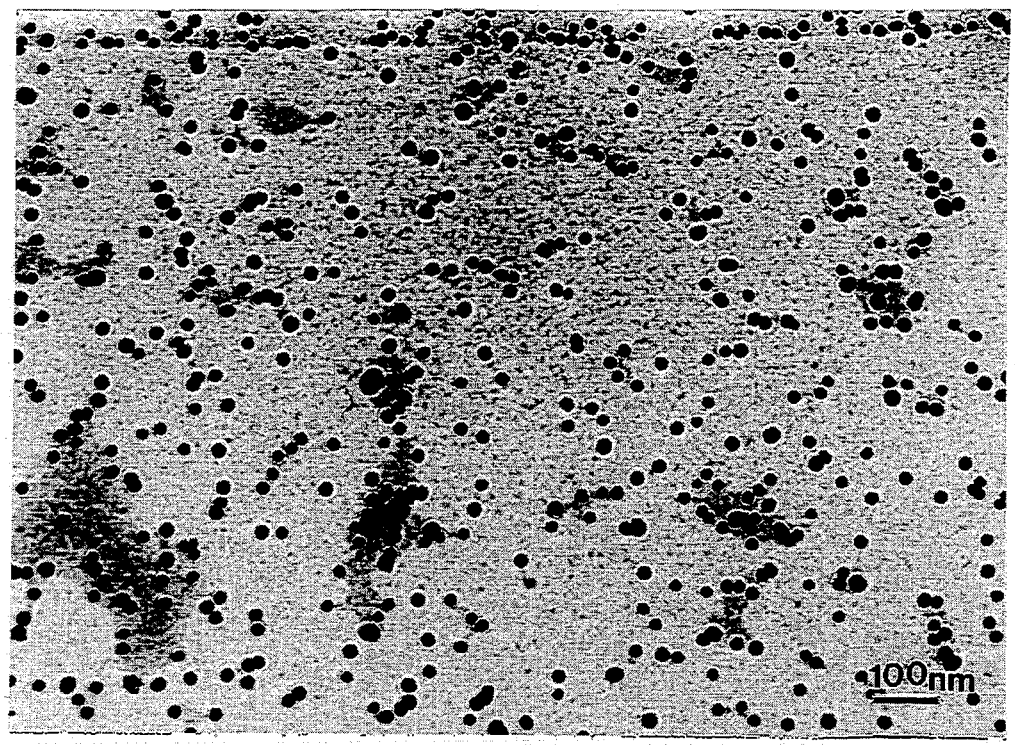
FIG. 4(a) is an electron microgram obtained by using the specimen-holding device shown in FIGS. 3(a) and 3(b)
Figure 4B:
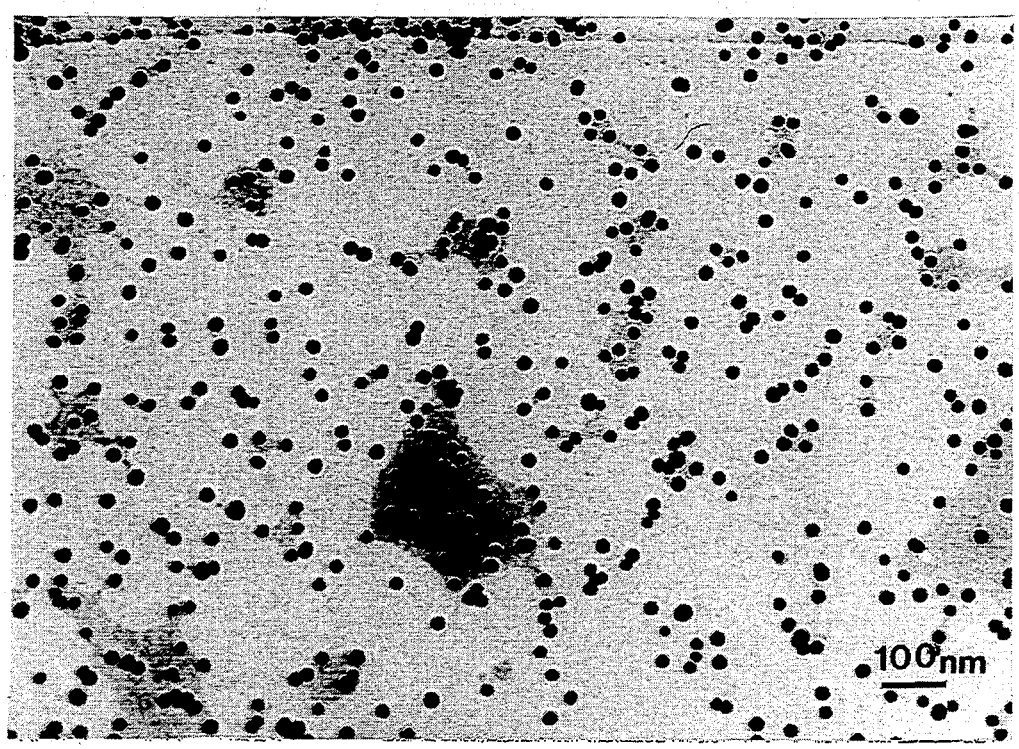
FIG. 4(b) is an electron microgram obtained immediately after FIG. 4(a)

In this case, the space sandwiched between the two thin films 14a and 14b of polyvinyl resin is quite thin, on the order of 0.1 μm. Therefore, the probability of collision of the electron beam EB with the molecules of water, oxygen and other substances existing inside the space enclosed by the thin films 14a and 14b is much lower than heretofore. If ions are generated by the collision, the amount of the ions is quite small. Hence, the damage that the specimen 11 sustained by the ions is negligibly small. This enables the specimen to be observed without being damaged and in an almost unmodified state. FIGS. 4(a) and 4(b) show examples of images obtained in this manner.

It is to be understood that the above embodiment merely constitutes one embodiment of the invention and that various changes and modifications are possible. In the above embodiment, the micro-grid is stuck on the metallic sheets. The thin films of plasma polymerized film are stuck as sealing members on the micro-grid. If the meshes are sufficiently small, then the thin films of plasma polymerized film may be directly stuck on the metallic sheets to form a vacuum seal. Furthermore, the sealing members are not restricted to thin films of plasma polymerized film. Thin strong films of other material can also be used if they are impervious to moisture and air but will pass the electron beam. In addition, reinforcing metallic sheets may be formed integrally with the thin films which transmit the electron beam.

As described thus far in the present invention, a specimen is sandwiched, along with liquid and gas, between two thin sheets which transmit an electron beam. Under this condition, the fringes of these thin films are sealed. This makes it possible to observe the specimen in ambient water. Hence, the specimen can be observed in an almost unmodified state. Furthermore, since the space enclosed by the two thin sheets transmitting the electron beam can be made quite thin, even if the electron beam illuminates this space, the amount of ions generated is quite small. Consequently, the damage to the specimen caused by ion bombardment can be reduced to a negligible level.

Having thus described our invention with the detail and particularity required by the Patent Laws, what is claimed and desired protected by Letters Patent is set forth in the following claims.

What is claimed:

1. A specimen-holding device for use with an electron microscope producing an electron beam and having an evacuated specimen chamber, said specimen-holding device comprising:

a pair of films which transmit the electron beam and between which a specimen to be investigated is placed;

a hermetical sealing mechanism for hermetically sealing fringes of said films to isolate a space sandwiched between said films from said specimen chamber of the microscope; and a specimen stage on which the specimen sandwiched between said films is placed.

2. A specimen-holding device for use with an electron microscope as set forth in claim 1, wherein said hermetical sealing mechanism comprises two O-rings pressed against said films, respectively.

3. A specimen-holding device for use with an electron microscope as set forth in claim 1, wherein said films transmitting the electron beam are reinforced with metallic reinforcing members.

4. A specimen-holding device as set forth in claim 1, wherein the films are polymer films supported by a metallic micro-grid and with a carbon film over the surface of the polymer film and the micro-grid.

5. A specimen-holding device for use with an electron microscope, said specimen-holding device comprising:

a first O-ring mounted to a lower portion of a specimen stage;

a first electron beam-transmitting film placed on a specimen support such that fringes of said specimen support are placed on said first O-ring;

a second electron beam-transmitting film disposed above said first electron beam-transmitting film;

a space which is sandwiched between said first and second electron beam-transmitting films and in which a specimen is enclosed together with liquid;

a presser plate for pressing said second beam-transmitting film against said lower portion the specimen stage together with said first electron beam-transmitting film; and a second O-ring mounted on said presser plate so as to abut against fringes of said second electron beam-transmitting film.

* * * * *

UNITED STATES PATENT AND TRADEMARK OFFICE
CERTIFICATE OF CORRECTION

PATENT NO. : 5,406,087
DATED : April 11, 1995
INVENTOR : Yoshinori Fujiyoshi and Mikio Naruse It is certified that error appears in the above-indentified patent and that said Letters Patent is hereby corrected as shown below:

Column 2 Line 41 "microgram" should read --micrograph--.

Column 2 Line 44 "microgram" should read --micrograph--.

Column 2 Line 61 "E" should read --EB--.

Column 2 Line 67 "ms" should read --is--.

Column 3 Line 7 "E." should read --EB.--.

Claim 5 Line 10 Column 6 after "lower portion" insert --of--.

Signed and Sealed this

Eighteenth Day of July, 1995

Attest:

BRUCE LEHMAN

*Attesting Officer*     *Commissioner of Patents and Trademarks*